United States Patent [19]

Matsuya

[11] Patent Number: 5,416,483
[45] Date of Patent: May 16, 1995

[54] METHOD AND CIRCUIT FOR NOISE SHAPING

[75] Inventor: Yasuyuki Matsuya, Isehara, Japan

[73] Assignee: Nippon Telegraph and Telephone Corporation, Tokyo, Japan

[21] Appl. No.: 989,136

[22] Filed: Dec. 11, 1992

[30] Foreign Application Priority Data

Dec. 12, 1991 [JP] Japan .................. 3-329126
Aug. 10, 1992 [JP] Japan .................. 4-212905

[51] Int. Cl.$^6$ ............................................. H03M 3/00
[52] U.S. Cl. ..................................... 341/143; 341/161
[58] Field of Search ............... 341/143, 166, 156, 161, 341/162

[56] References Cited

U.S. PATENT DOCUMENTS 4,862,169  8/1989  Van Bavel et al. .................. 341/143
5,153,593  10/1992  Walden et al. ...................... 341/143

OTHER PUBLICATIONS (J-SC/22/6//17214) A 16-Bit Oversampling A-to-D Conversion Technology Using Triple-Integration Noise Shaping, Matsuya et al., IEEE Journal of Solid State Circuits, SC-22(6):921-929 (1987).
A Multi-Stage Noise Shaping 16 Bit CMOS A to D Conversion LSI, Matsuya et al. ICD87-52:7-12 (1987).
The Design of Sigma$\geq$Delta Modulation Analog-to-Digital Converters, Boser et al., Reprinted from IEEE J. Solid-State Circuits, SC-23:1298-1308.
Improved Double Integration Delta-Sigma Modulations For A to D to A Conversion, Shoji et al., Reprinted from IEEE Proc. ISCAS 87:451-454 (1987).

*Primary Examiner*—Howard L. Williams
*Attorney, Agent, or Firm*—Finnegan, Henderson Farabow, Garrett & Dunner

[57] ABSTRACT

A noise shaping circuit permitting a wide dynamic range for input signal and having an improved S/N ratio. In FIG. 1, the circuit comprises a delay part 3 for delaying the output signal for a one-sampling period; a first subtraction part 1 for subtracting the delayed signal, via the delay part 3 from the input signal imparted to the input terminal so as to generate first subtraction results; a first integration part 2 for integrating the first subtraction results; a second subtraction part 4 for subtracting the input signal from the first integrated value of the part 2; a second integration part 5 for integrating the second subtraction value so as to obtain a second integrated value; an addition part 7 for adding the first and second integrated values so as to obtain an addition results, and a quantizer 6 for quantizing the addition results. The amplitude of the signal imparted to the part 5 is minimized by means of the part 4, so that the dynamic range of the part 5 is utilized with high efficiency.

6 Claims, 11 Drawing Sheets

J = 1    K = 0.5

METHOD AND CIRCUIT FOR NOISE SHAPING

BACKGROUND OF THE INVENTION

1. Field of the Invention

The present invention relates to methods and circuits for noise shaping, especially for noise shaping analog and digital circuits which widely distribute the quantize noise, due to the analog-to-digital conversion, outside the signal frequency band, so as to minimize the quantize noise in the signal frequency band and to obtain the high accuracy.

2. Background Art

FIG. 17 shows a signal flow of a conventional type second-order Δ-Σ noise shaping circuit. In the drawing, the circuit is adopted with a commonly-used noise shaping technique wherein the second order noise shaping characteristics are obtained by a Δ-Σ oversampling method. Such a technique is, for example, disclosed in the publication "Oversampling A-D conversion technique", NIKKEI Electronics Nos. 452–454, Nikkei BP Co. The second-order Δ-Σ noise shaping circuit shown in FIG. 17 consists mainly of an input terminal 11 for receiving an input signal X, an output terminal 12 for generating an output signal Y, subtractors 13 and 19, integrators 15 and 16 in which the transfer functions, utilizing the z-function, are referred to as $1/(1-z^{-1})$, a quantizer 17 for executing the quantization so as to generate a quantize noise Q, and a one-sampling delay 18, respectively. In general cases, the one-sampling delay 18 will be composed as a D-to-A converter in the case of A-to-D conversion, while the delay 18 will be composed as a DFF (Delay Flip-Flop) in the case of D-to-A conversion.

The following is a description of the signal flow of the second-order Δ-Σ noise shaping circuit shown in FIG. 17. First, the input signal X applied to the input terminal 11 is supplied to the subtractor 13. Furthermore, a delay signal D, namely the output signal Y delayed for one-sampling period via the one-sampling delay 18, is also supplied to the subtractor 13. The subtractor 13 subtracts the delay signal D from the input signal X and supplies the subtraction results to the integrator 15. The integrator 15 integrates the supplied signal and generates an output signal N, i.e. the integration results, to the subtractor 19. The subtractor 19 subtracts the delay signal D from the output signal N and supplies the subtraction results to the integrator 16. The integrator 16 integrates the supplied signal and generates an output signal M, i.e. the integration results, to the quantizer 17. The signal, quantized in the quantizer 17, is then generated from the output terminal 12 in the way of the output signal Y.

FIG. 10 shows a more detailed circuit diagram of the conventional second order Δ-Σ noise shaping circuit shown in FIG. 17.

Generally, as shown in FIG. 10, when the configuration in FIG. 17 is applied to an A-to-D converter, the integrators 15 and 16 will be realized by inverting amplifiers 115 and 116, and capacitors 51 and 52. The output signal Y of the quantizer 17 in FIG. 17 is supplied to the one-sampling delay 18 and delayed for a one-sampling delay period. The output signal Y, delayed for a one-sampling period, is then simultaneously supplied to the subtractors 13 and 19. However, in the case where the inverting amplifiers 115 and 116 are adopted as shown in FIG. 10, the plus/minus sign of the delayed output signal Y is inverted therein.

In FIG. 17, the output signal Y is generated by the quantizer 17 and delayed for one-sampling period. In FIG. 10, this signal having the one-sampling delay is generated by D-to-A converters 118 and 118'. Furthermore, the output signal Y, having the one-sampling delay and the sign thereof being inverted, is added with the input signal by means of resistor $R_2$, so that, essentially, a subtraction is executed. This signal is then integrated by the inverting amplifier 115 and the integrated results, referred to as the output signal N, is generated. Because the sign of the output signal N has been inverted, the signal addition executed by a resistor $R_4$ in the next stage, with the output signal Y having one-sampling delay, is essentially deemed to be a subtraction. The signal supplied to the Inverting amplifier 116 is then integrated therein, so that an integration results, referred to as the output signal M, is generated. The signal M is then quantized by a comparator 117 and generated via the output terminal 12 as the output signal Y.

The circuit shown in FIG. 17 can be expressed by the following formulae (1) to (3) wherein symbols N, M, Q and X designates the output signal of the integrator 15, the output signal of the integrator 16, quantize noise in the quantizer 17, and the final output signal, respectively, so that the characteristics of this circuit can be analyzed by solving these formulae.

$$N = \frac{1}{1 - z^{-1}} (X - YZ^{-1}) \tag{1}$$

$$M = \frac{1}{1 - z^{-1}} (N - YZ^{-1}) \tag{2}$$

$$Y = M + Q \tag{3}$$

The following formula (4) is obtained by solving the above formulae (1) to (3) concerning the input signal X and output signal Y.

$$Y = X + (1 - z^{-1})^2 Q \tag{4}$$

In formula (4), the term "$(1-z^{-1})$" designates the differential, so that the output signal Y is equal to the additional results of the input signal X and second order differential of the quantize noise Q. The quantize noise Q is a noise having a Gaussian distribution regardless of the frequency, namely the white noise shown in FIG. 18. FIG. 18 shows the noise shaping effect concerning the quantize noise Q. In the drawing, the curve Q shows the quantize noise Q, and the curve b shows the secondary differentiated results of the quantize noise Q.

According to this drawing, in which the ordinate axis shows the power and the transverse axis shows the frequency, the secondary differentiated results "$b=(1-z^{-1})^2 Q$" are distributed such that components in the low frequency region are low and those in the high frequency region are high. Such a characteristic is so called the "noise shaping". As described above, according to the conventional noise shaping technique shown in FIG. 18, the quantize noise (white noise) having the Gaussian distribution is deformed. In addition, the high frequency region of the deformed noise is eliminated by means of a filter so as to minimize the noise components in the low frequency region, and to produce only those in the low frequency region. Therefore, even when a low resolution quantizer is utilized, highly accurate characteristics can be obtained.

The following is a description of the MASH (Multistage noise SHaping) method (IEEE Journal of Solid-State Circuit Vol. 22, No. 6, pp 921-929, December 1987) which has been proposed for the conventional Δ-Σ oversampling technique.

FIG. 9 shows the signal flow of the conventional noise shaping digital circuit utilizing the MASH technique, and realizing the circuit having the second-order noise shaping characteristics, as in FIG. 10 by means of the MASH method. In the drawing, components corresponding to those of FIG. 17 are attached with the same symbols. The circuit shown in FIG. 9 comprises a subtractor 41, a differentiator 42 and an adder 43, which are not contained in the circuit in FIG. 17.

The signal flow of the circuit will be described first. The input signal X imparted to the input terminal 11 is supplied to the subtractor 13. The first quantizer 17 generates an output signal Y1. The signal Y1 is supplied to the one-sampling delay 18 wherein the signal is delayed for a one-sampling period. The delayed signal is then supplied to the subtractor 13. The subtractor 13 subtracts the output signal Y1 delayed for a one-sampling period, from the input signal X, and supplies the subtraction results to the first integrator 15. The first integrator 15 integrates the imparted signal thereto and supplies, to the subtractor 41, the integration results referred to as the output signal N. The subtractor 41 subtracts, from the input signal X, the output signal N generated by the first integrator 15. The subtractor 19 subtracts an output signal Y2, generated by a second quantizer 17' and delayed for a one-sampling period, from the subtraction results P of the subtractor 41. The output signal of the subtractor 19 is then supplied to the second integrator 16 and integrated whereby the integrated results are produced in the way of the output signal M. The signal M is then supplied to a second quantizer 17' so as to quantize the signal M and to generate the quantized results, namely the output signal Y2. The signal Y2 is then differentiated by the differentiator 42, and the differentiated results thereof is supplied to the adder 43. The output signal Y1, quantized in the first quantizer 17, is added with the differentiated results in the differentiator 42, and the addition results are generated by the output terminal 12 in the way of the output signal Y.

The circuit, utilizing the MASH technique, shown in FIG. 9 is aimed at improving stability. More specifically, in the case of the conventional Δ-Σ oversampling technique, the signal flow of the circuit in FIG. 17 is "subtractor 13→first integrator 15→subtractor 19→second integrator 16→ quantizer 17→one-sampling delay 18→subtractor 13". In this signal flow, two integrators are maintained in a series and have a 180° phase delay, so that the circuit is naturally unstable. In contrast, the circuit shown in FIG. 9, concerning the MASH technique, contains two loops, the loop "subtractor 13→integrator 15→quantizer 17→one-sampling delay 18→subtractor 13", and the loop "subtractor 19→integrator 16→quantizer 17'→one-sampling delay 18'→subtractor 19". Each loop contains only one integrator so that the respective phase loop will be maintained at 90° and so that the circuit is absolutely stable.

When the circuit in FIG. 9 is expressed by the z-function, the following formulae (5) to (8) concerning the output signal Y1 of the first quantizer 17, output signal Y2 of the first quantizer 17', the subtraction results P and the one-sampling delay 18 are obtained respectively.

$$Y_1 = X + (1-z^{-1})Q_1 \quad (5)$$

$$Y_2 = P + (1-z^{-1})Q_2 \quad (6)$$

$$P = -Q_1 \quad (7)$$

$$Y = Y_1 + (1-z^{-1})Y_2 \quad (8)$$

Then, the following formula (9) is obtained by solving the above formulae (5) to (8).

$$\begin{aligned} Y &= Y_1 + (1-z^{-1})Y_2 \\ &= X + (1-z^{-1})Q_1 - (1-z^{-1})Q_1 + (1-z^{-1})^2 Q_2 \\ &= X + (1-z^{-1})^2 Q_2 \end{aligned} \quad (9)$$

Because formula (9) has the same configuration as formula (4), it is understood that the circuit shown in FIG. 9 has the second order noise shaping characteristics similar to that shown in FIG. 17.

However, when the above formulae are solved relating to the output signals M and N concerning the integrators 15 and 16 respectively, the following formulae (10) and (11) are obtained.

$$N = X - z^{-1}(1 - z^{-1})Q \quad (10)$$

$$M = X - z^{-1}Q - z^{-1}(1-z^{-1})Q \quad (11)$$

The above formula (10) defines the output signal N of the integrator 15, and the other formula (11) defines the output signal M of the integrator 16. If the maximum absolute values of those signals do not exceed the dynamic ranges of integrators 15 and 16, stable noise shaping can be executed. However, if either value exceeds the corresponding dynamic range, the signal with the exceeded value is clipped at the maximum level or the minimum level of the respective integrators 15 and 16. If either signal is clipped, a drastic degradation of the S/N ratio will result accordingly. Because there is no correlative function existing between the input signal and quantize noise Q, the maximum absolute values of the output signal N of integrator 15 and that of output signal M of the integrator 16 are expressed by the following formulae (12) and (13) respectively, with the proviso "$X >> (1-z^{-1})Q$" in the low frequency region.

$$N = |X| + |z^{-1}(1-z^{-1})Q| = |X| \quad (12)$$

$$\begin{aligned} M &= |X| + |z^{-1}Q| + |z^{-1}(1-z^{-1})Q| \\ &= |X| + |Q| \end{aligned} \quad (13)$$

According to the above formulae (12) and (13), it is clearly understood that the integrators 15 must have the $|X|$ of the dynamic range and the integrator 16 must have the $|X| + |Q|$ of the dynamic range in order to obtain the stable operation of the second-order Δ-Σ noise shaping circuit. According to the noise shaping technique, even if the quantizer 17 has low resolution, a highly accurate signal can be obtained. Therefore, in most cases, the quantize noise Q will be enlarged so that the wide dynamic range is required for the second-stage integrator. Especially, when the noise shaping circuit is utilized with low-voltage type A-to-D converter, a serious problem may be caused. That is, the integrator mainly consists of an operational amplifier and a capacitor, and the dynamic range of the operational amplifier is comparatively small. Furthermore, the substantial dynamic range will be further decreased equal to the difference between the original dynamic range and the absolute value of the quantize noise $|Q|$. However the quantity of noise quantity respectively imparted to the transistors and power sources is constant whether or not the dynamic range is decreased. As a result, there would be yet another problem that the S/N ratio is degraded with the decrease in dynamic range of the input signal.

Meanwhile, in the case of the MASH technique, having a stable second order $\Delta\text{-}\Sigma$ noise shaping circuit, the output signal N of the integrator 15 can be obtained in the following formula (14).

$$N = X - Q_1 = |X| + |Q_1| \tag{14}$$

Similarly, the output signal M of the integrator 16 can be obtained in the following formula (15).

$$M = -Q_1 - Q_2 - |Q_1| + |Q_2| \tag{15}$$

According to the formulae (14) and (15), concerning the output signal N of the integrator 15 and the output signal M of the integrator 16, the maximum value of the output signal of the integrator 15 is $N = |X| + |Q_1|$. Consequently the dynamic range of $|X| + |Q_1|$ is required for the integrator 15 and, simultaneously, the dynamic range of the input signal is decreased so that the S/N ratio is degraded.

SUMMARY OF THE INVENTION

It is accordingly, the first object of the present invention to provide a method and circuit for noise shaping for preventing the decrease in dynamic range and degradation of the S/N ratio.

In the first aspect of the present invention, there is provided a noise shaping circuit (FIG. 2) having first subtraction means (13) for obtaining a difference between an input signal and a feedback signal; first integration means (15) for integrating the difference and for generating first integration results (N); second integration means (16) for integrating a value which varies in response to the first integration results and for generating second integration results (M); and feedback signal generation means (17, 18) for generating a feedback signal in response to the second integration results. The noise shaping circuit further comprises:
  second subtraction means (19) for supplying a difference between the input signal and the first integration results to the second integration means; and
  addition means (14) for supplying, addition results between the first integration results and the second integration results, to the feedback signal generation means.

The present invention can be embodied as shown in FIG. 1 wherein the noise shaping circuit comprising:
  delay means 3 for delaying an output signal for one-sampling period;
  first subtraction means 1 for subtracting the signal, delayed by the delay means 3, from an input signal imparted to an input terminal so as to obtain first subtraction results;
  first integration means 2 for integrating the first subtraction results so as to obtain a first integrated value;
  second subtraction means 4 for subtracting the input signal from the first integrated value so as to obtain a second subtraction value;
  second integration means 5 for integrating the second subtraction value so as to obtain a second integrated value;
  adding means 7 for adding the first and second integrated values so as to obtain an addition results; and
  quantizer means 6 for quantizing the addition results.

Furthermore, the above described circuit may be modified such that the first integration means comprises a first multiplier for multiplying the first integrated value with a first coefficient, and the second integration means comprises first integration means 2 and a second multiplier for multiplying the second integrated value with a second coefficient.

Furthermore, the circuit may be modified such that each of the first and second integration means 2 and 5 comprise an inverting amplifier for inverting tile sign of the input signal and for amplifying, and the quantizer means 6 is embodied by a differential comparator for executing the quantization in response to the output signals respectively generated by the first and second integration means.

According to the present invention, the output signal, delayed for one-sampling period, is subtracted from the input signal, the subtraction results are then integrated, and the integrated value is subtracted by the input signal in the subtractor and further integrated. Then, the double integral value and the single integral value are added, and the addition results are quantized by the quantizer and generated. Therefore, the amplitude of the output signal of the integrator can be set comparatively narrower than the conventional circuit, so that the dynamic range of the signal component can be enlarged and the degradation of the S/N ratio can be prevented.

As described above, the present invention remarkably differs from the prior art at the points where the input signal is subtracted from the output signal of the first integration means, and at the point where the addition results of the output signals of the first and second integration means are supplied to the quantizer means.

Therefore, according to the present invention, the dynamic ranges of the integrators are utilized with high efficiency, the dynamic ranges of the input signal can be widened, and the S/N ratio can be improved. Furthermore, the output signal having one-sampling delay is merely supplied to the subtractor, so that the required number of D-to-A converters, conventionally "two", can be decreased to "one". Furthermore, when the differential comparator is adopted for the quantization, the circuit configuration can be simplified such that the adder and the quantizer are embodied by one circuit.

The present invention can be further embodied as shown in FIG. 11 wherein the noise shaping circuit comprising:
  a first quantizer 1017 and a second quantizer 1020 for respectively quantizing signals imparted thereto;
  first addition means 1013 for generating a first addition signal wherein the first addition signal is a member of the group consisting of simplified first addition results between an output signal Y1 of the first quantizer 1017 and an inverted output signal of the second quantizer 1020, and complicated first addition results between the input signal and the simplified addition results divided by a specific value and delayed for one-sampling period by means of delay means 1018;

first integration means 1051 for integrating the first addition signal, for inverting an integrated results therein, and for generating an inverted results as an inverted signal N;

second integration means 1052 for integrating an addition results between the output signal N of the first integration means 1051 and the input signal, for inverting an integrated signal, and for generating an inverted results as an inverted signal M; and second addition means 1014 for imparting, to the second quantizer 1020, the signal M generated by the second integration means 1052, and for generating a second addition signal wherein the second addition signal is a member of the group consisting of simplified second addition results between the output signal Y1 of the first quantizer 1017 and an inverted output signal Y2 of the second quantizer 1020, and results of the simplified second addition results divided by the specific value.

The present invention can be further embodied as shown in FIG. 15 wherein the noise shaping circuit comprising:

a first quantizer 1017 and a second quantizer 1020 for respectively quantizing signals imparted thereto;

first addition means 1021 for generating a first addition signal wherein the first addition signal is a member of the group consisting of simplified first addition results and complicated first addition results, wherein the simplified addition results are obtained by adding the output signal Y1 generated by the first quantizer 1017 and delayed for one-sampling period by means of a first delay means 1018 and an inverted output signal Y2 generated by the second quantizer 1020, inverted and delayed for one-sampling period by a second delay means 1018', and the complicated addition results are obtained by dividing the simplified first addition results by a specific value;

second addition means 1013 for adding tile first addition signal and the input signal and for generating an addition results;

first integration means 1051 for integrating the addition results generated by the second addition means 1013 and for generating an inverted integrated results as an inverted signal N;

second integration means 1052 for integrating an addition results between the inverted signal N generated by the first integration means 1051 and the input signal, and for supplying, to the second quantizer 1020, an inverted integrated results as an inverted signal M; and third addition means 1014 for imparting, to the first quantizer 1017, the output signal N of the first integration means 1051, and for generating a third addition signal wherein the third addition signal is a member of the group consisting of simplified third addition results between the inverted output signal Y2 of the second quantizer 1020 and the output signal Y1 generated by the first quantizer 1017, and a divided results of the simplified third addition results by the specific value.

Conventionally, the subtraction is executed at the pre-stage of the quantizer. In contrast, according to the present invention, the quantization is executed earlier and subtraction is executed later. Because the quantized signal is a digital value, an addition can easily be substituted for subtraction by making "two's" a complement of the value.

As described above, the present invention, relating an analog-circuit having a quantizer and an inverter, adds the noise of first quantizer and that of second quantizer. Accordingly, the circuit has the complete second-order noise shaping characteristics.

Other objectives and advantages of the present invention will be become apparent from the detailed description to follow taken in conjunction with the appended claims.

DESCRIPTION OF THE PREFERRED EMBODIMENTS

First embodiment

Figure 1:
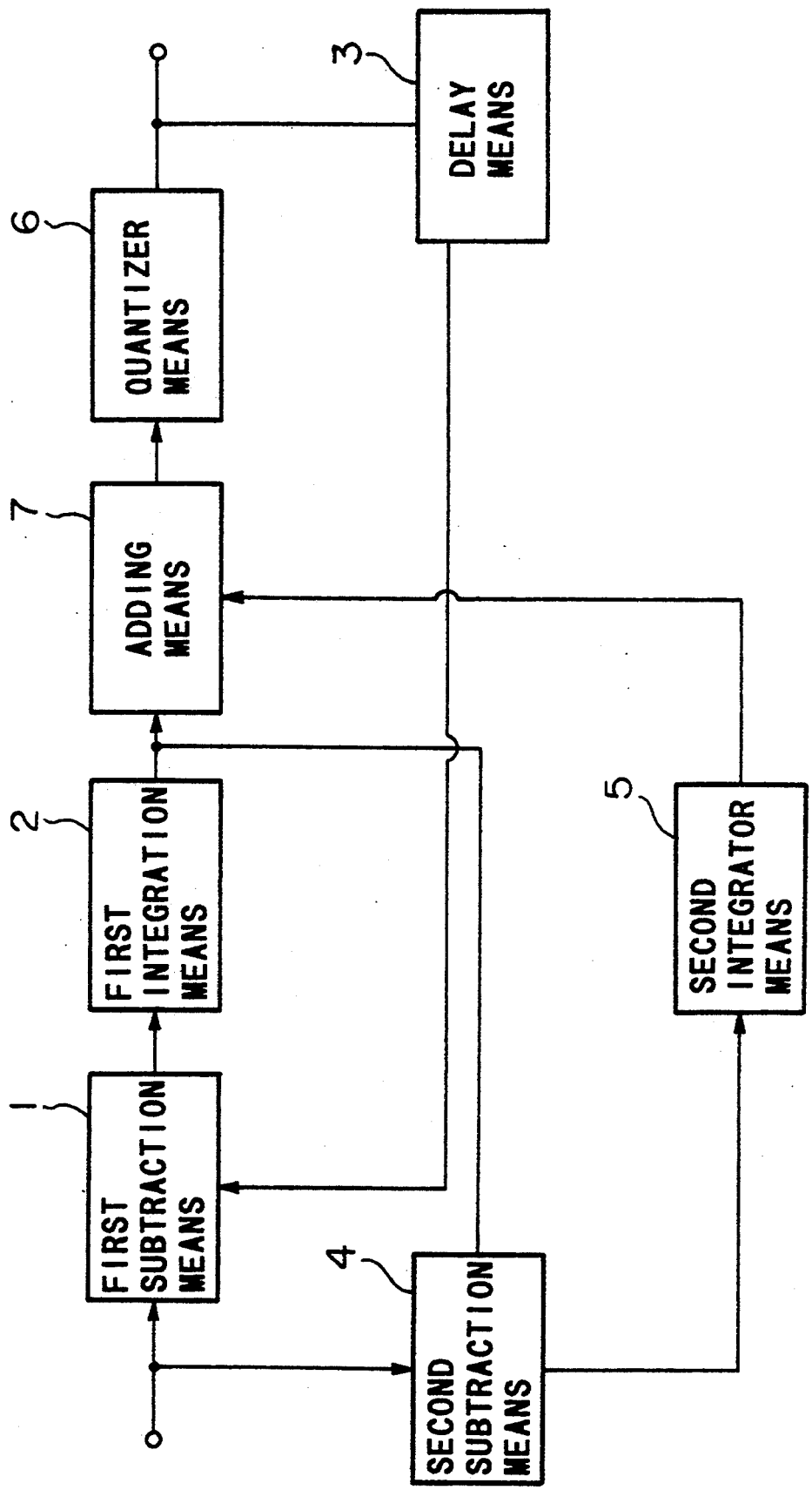
FIG. 1 is a block diagram showing an example of the concept of the present invention.
Figure 2:
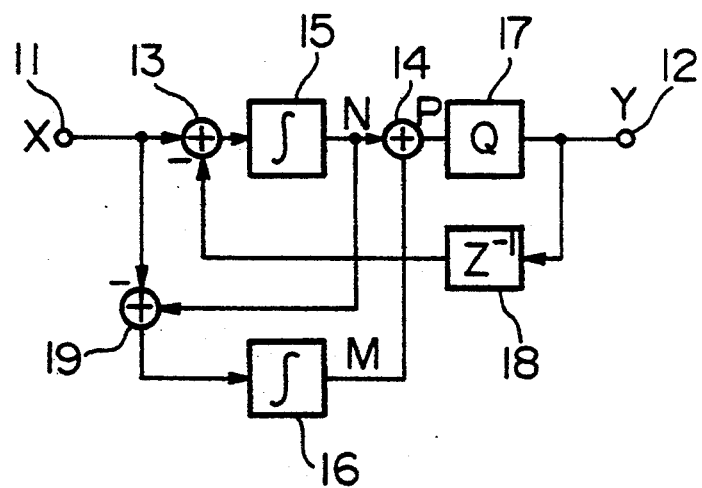
FIG. 2 is a block diagram showing a signal flow of the noise shaping circuit according to the first embodiment of the present invention.
Figure 9:
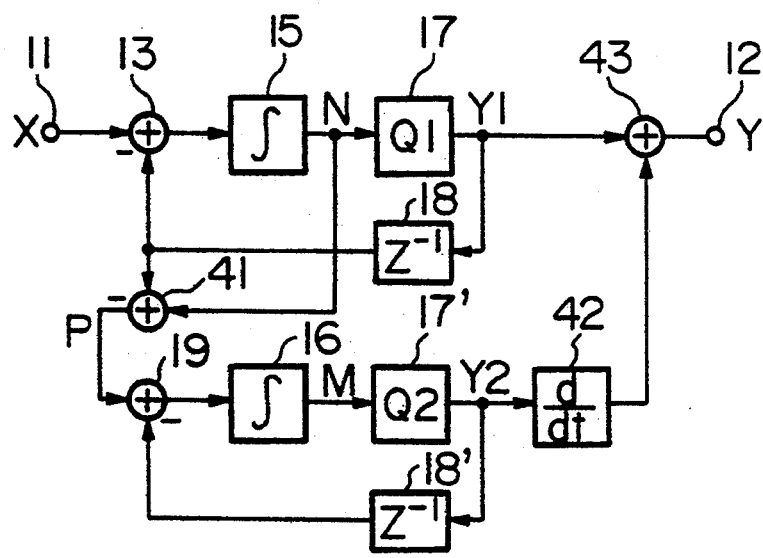
FIG. 9 is a block diagram showing the signal flow of the conventional noise shaping circuit utilizing the MASH technique.
Figure 10:
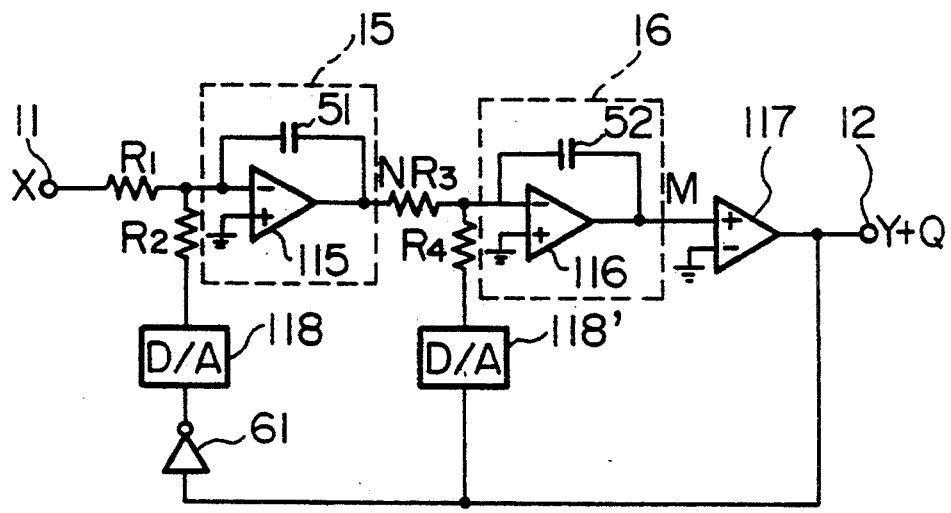
FIG. 10 is a circuit diagram of the conventional second order $\Delta$-$\Sigma$ noise shaping circuit.

FIG. 2 shows the signal flow of a noise shaping circuit concerning the first embodiment of the present invention. In the drawing, components corresponding to those of FIG. 9 are attached with the same symbols. In FIG. 2, the input signal X is imparted to the subtractor 13 via the input terminal 11. Meanwhile, the output signal Y is supplied to the one-sampling delay 18, whereby the output signal Y having the one-sampling delay is supplied to the subtractor 13. The subtractor 13 subtracts the output signal Y having the one-sampling delay from the input signal X and supplies the subtraction results to the integrator 15. The integrator 15 integrates the subtraction results supplied therein. The integrator 15 then supplies the output signal N to the subtractor 19. The subtractor 19 subtracts the input signal X from the output signal N of the integrator 15, and supplies the subtraction results to the integrator 16. The integrator 16 integrates the subtraction results supplied therein and supplies the integration results to the an adder 14. The adder 14 adds the output signal N of the integrator 15 and the output signal M of the integrator 16, and generates the addition result P to the quantizer 17. The quantizer 17 quantizes the addition result E so as to generates the output signal Y.

The aim of the configuration shown in FIG. 2 is to obtain the output signal Y by means of subtracting the input signal X from the output signal N of the integrator 15, of adding the output signal N of the integrator 15 and the output signal M of the integrator 16, and of supplying the addition results to the quantizer 17.

The configuration shown in FIG. 2, i.e. the output signal N of the integrator 15, the output signal M of the integrator 16, the addition results P of the adder 14 and the output signal Y of first quantizer 17, can be expressed by the following formulae (16) to (19) in the z-function.

$$N = \frac{1}{1 - z^{-1}} (X - Yz^{-1}) \quad (16)$$

$$M = \frac{1}{1 - z^{-1}} (N - X) \quad (17)$$

$$P = N + M \quad (18)$$

$$Y = P + Q \quad (19)$$

When the above formulae (16) to (19) are solved for the output signal Y, the following formula (20) concerning the output signal Y is obtained.

$$Y = X + (1 - z^{-1})^2 Q \quad (20)$$

The formula (20), having a similar configuration to the formulae (4) and (13), expresses the second order noise shaping characteristics. Furthermore, when the above formulae are solved for the output signals N and M of the integrators 15 and 16, the following formulae (21) and (22) are obtained.

$$N = X - z^{-1}(1 - z^{-1})Q \approx |X| \quad (21)$$

$$M = -z^{-1}Q \approx |Q| \quad (22)$$

Accordingly, the output signals N and M can be considered as the approximate value of the input signal X and the output signal Q of the quantizer respectively. Furthermore, because there is a correspondence "$X >> (1 - z^{-1})Q$" in the signal frequency band, the maximum value of the output signal N of the integrator 15 becomes $|X|$, and the maximum value of the output signal M of the integrator 16 becomes $|Q|$.

Figure 12:
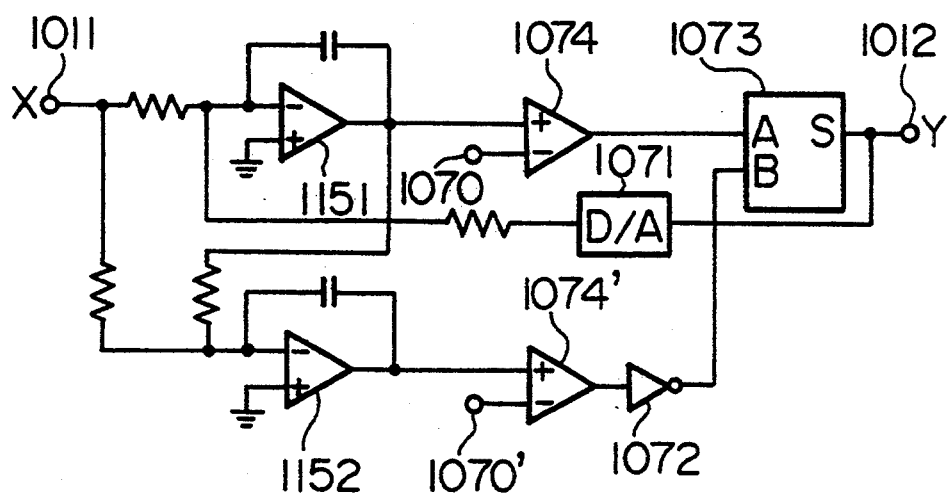
FIG. 12 is a circuit diagram of the noise shaping circuit according to the fifth embodiment of the present invention.

According to the conventional configuration shown in FIGS. 9 and 12, the maximum values of the output signals of the integrators become $|X| + |Q|$. In contrast, according to the first embodiment of the present invention, the maximum value of the output signal N of the integrator 15 is reduced by $|Q|$, and that of the output signal M of the integrator 16 is reduced by $|X|$.

Second embodiment

Figure 3:
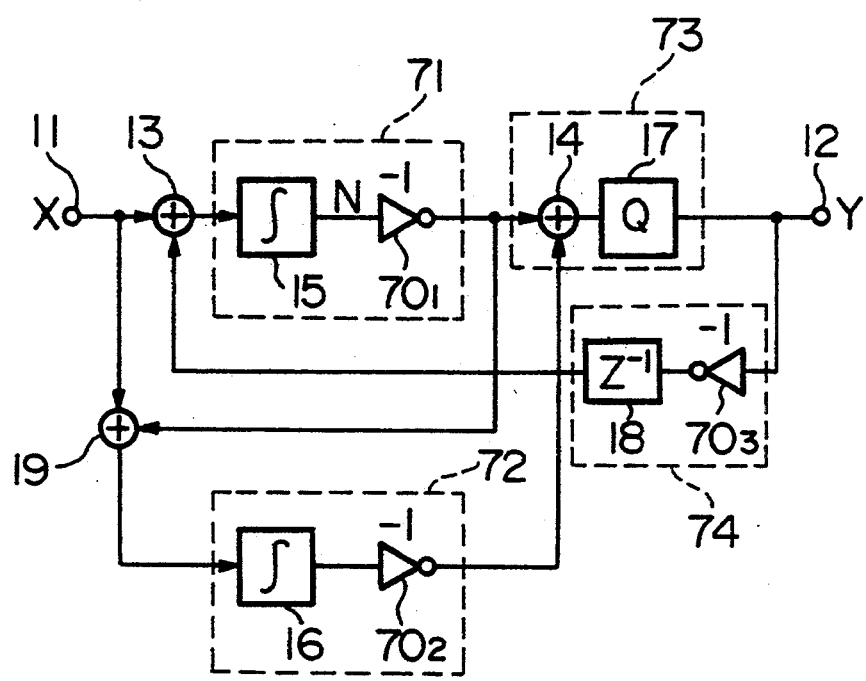
FIG. 3 is a block diagram showing a signal flow of the noise shaping circuit according to the second embodiment of the present invention.

FIG. 3 shows a signal flow of the noise shaping circuit according to the second embodiment of the present invention. In the drawing, components corresponding to those of FIG. 2 are attached with the same symbols. The shaping circuit according to the second embodiment of the present invention comprises inverters $70_1$, $70_2$ and $70_3$ in order to invert the signs of signals. The inverters $70_1$ and $70_2$ are respectively provided in the next stages of the integrators 71 and 72, and the inverter $70_3$ is provided in the prior stage of the one-sampling delay 18. The adder 14 and the first quantizer 17 composes a quantizer 73. The signal flow of the second embodiment is similar to that of the first embodiment.

Figure 4:
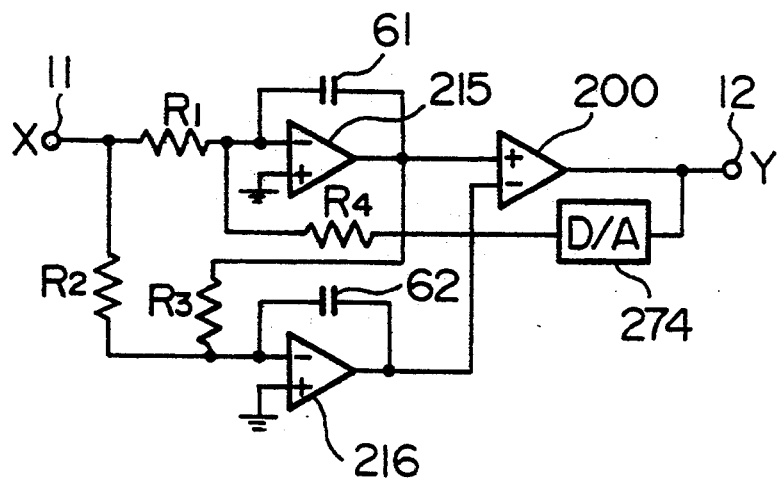
FIG. 4 is a circuit diagram of the noise shaping circuit according to the second embodiment of the present invention.

FIG. 4 shows the circuit diagram of the noise shaping circuit of a practical example of the composition shown in FIG. 3, according to the second embodiment of the present invention.

In the drawing, the subtractors 13 and 19 are exchanged by adders realized by resistors $R_1$ and $R_2$ respectively. The integrator 71 is realized by a circuit comprised of an inverting amplifier 215 and a capacitor 61, which inverts the sign of the input signal thereto and amplifies the inverted signal. Similarly, the integrator 72 is realized by an inverting amplifier 216 and a capacitor 62. The quantizer 73 is realized by a differential comparator 200, having both functions of the adder 14 and first quantizer 17, which executes the quantization in response to the output signal of the inverting amplifier 215 and that of the amplifier 216. Furthermore, the delay part 74 comprised of the one-sampling delay 18 and the inverter $70_3$, is realized by a D-to-A converter 274 which includes an inverter.

As described above, when the noise shaping circuit according to the second embodiment is adopted for the A-to-D converter, the circuit can be realized by commonplace analog devices.

Third embodiment

Figure 5:
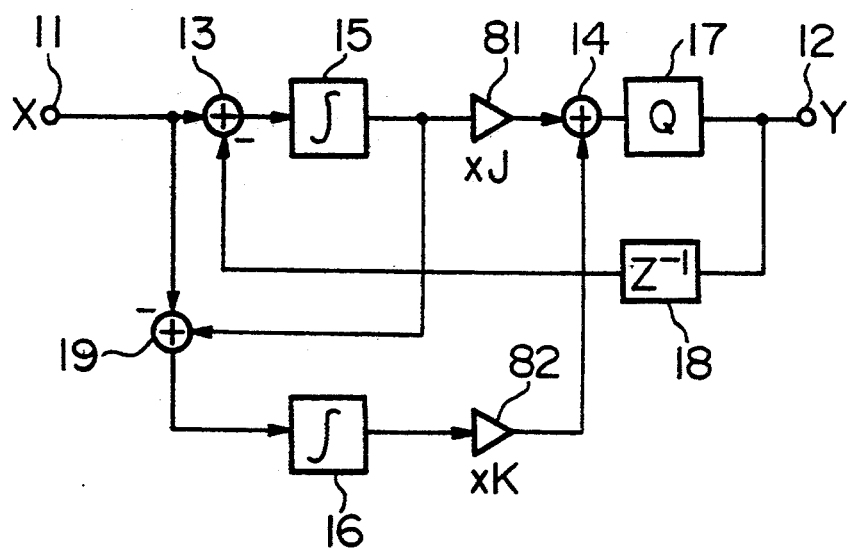
FIG. 5 is a block diagram showing a signal flow of the noise shaping circuit according to the third embodiment of the present invention.

FIG. 5 shows a signal flow of the noise shaping circuit according to the third embodiment of the present invention. According to the third embodiment, a multiplier 81 for multiplying a coefficient J by the signal imparted thereto, and a multiplier 82 for multiplying a coefficient K by the signal imparted thereto, are provided at the next stage of the integrators 15 and 16, respectively.

Figure 6:
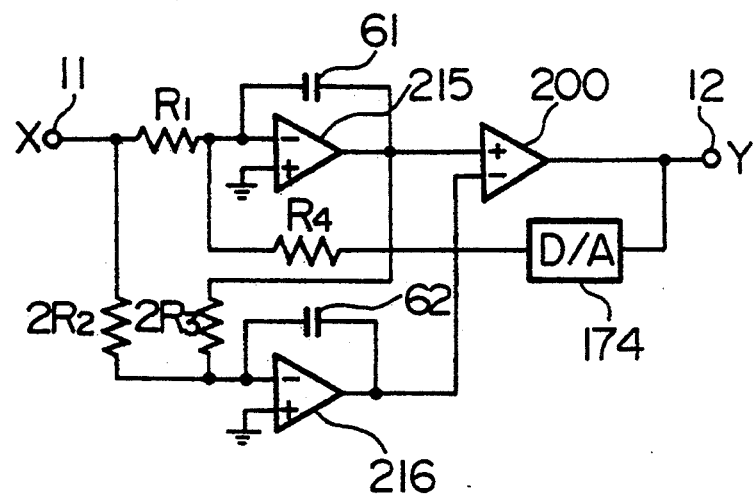
FIG. 6 is a circuit diagram of the noise shaping circuit according to the third embodiment of the present invention.

If the coefficients J and K are less than "1", the multipliers 81 and 82 can be embodied by dividing resistors. FIG. 6 shows a practical example of the noise shaping circuit according to the third embodiment of the present invention. In the drawing, components corresponding to those of FIG. 4 are attached with the same symbols. The circuit shows the example wherein the coefficient K is "0.5", and coefficient J is "1". The resistors $R_2$ and $R_3$ shown in FIG. 4 are doubled in FIG. 6 in order to set the coefficient K at "0.5".

Fourth embodiment

Figure 7:
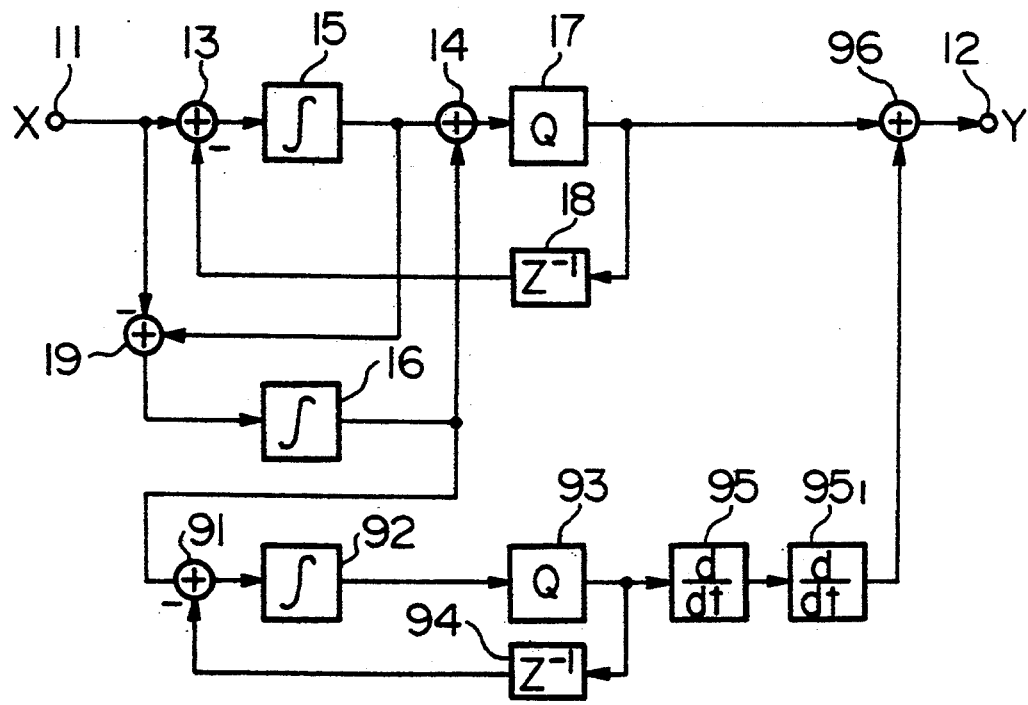
FIG. 7 is a block diagram showing a signal flow of the noise shaping circuit according to the fourth embodiment of the present invention.

FIG. 7 shows a signal flow of the noise shaping circuit according to the fourth embodiment of the present invention. According to the fourth embodiment, a first-order $\Delta$-$\Sigma$ circuit and MASH technique are added to the configuration according to the first embodiment, so as to obtain the third order noise shaping characteristics. More specifically, the circuit according to the first embodiment is adopted for the first stage of the noise shaping circuit concerning the MASH technique shown in FIG. 12.

If the conventional second order $\Delta$-$\Sigma$ noise shaping circuit shown in FIG. 9 is adopted for the first stage of the circuit shown in FIG. 12 so as to obtain the third-order noise shaping characteristics, the output signal M of the integration circuit in FIG. 9 should be supplied to the second stage. However, according to the above formula (6), the output signal M of the integration circuit should be the sum of the input signal X and the quantize noise Q. Therefore, the input voltage thereto should be enlarged.

In contrast, according to the fourth embodiment, concerning the above formula (22), the input signal to the second stage is only the quantize noise Q. Therefore, the fourth embodiment is advantageous where a required dynamic range can be made comparatively narrower than that of the above described combination. Furthermore, the circuit according to the present invention can also be adopted for the second stage so as to obtain the fourth-order noise shaping characteristics.

Figure 8:
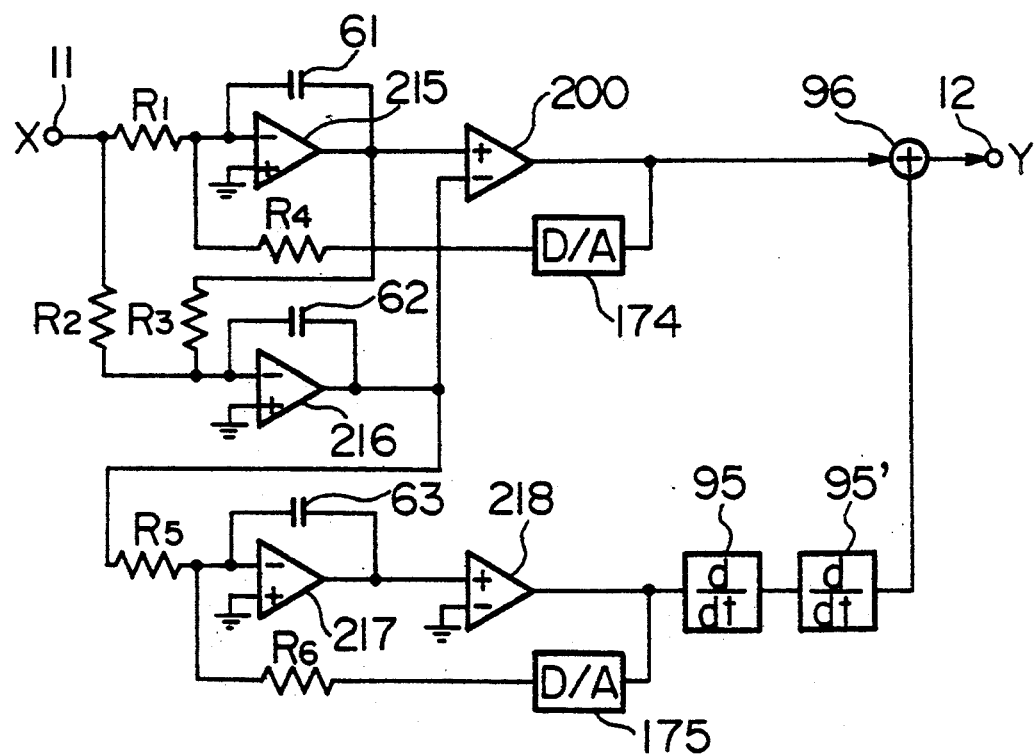
FIG. 8 is a circuit diagram of the noise shaping circuit according to the fourth embodiment of the present invention.

FIG. 8 shows a circuit diagram, which is a practical example of the composition shown in FIG. 7, of the noise shaping circuit according to the fourth embodiment of the present invention.

The circuit configuration of this embodiment is similar to that shown in FIG. 4, further comprising the first-order $\Delta$-$\Sigma$ circuit. The circuit utilizing the $\Delta$-$\Sigma$ oversampling technique receives the output signal of the integrator 216. The signal generated by a comparator 218 is delayed for one-sampling period by means of D-to-A converter 175, and subtraction is executed by resistors $R_5$ and $R_6$. The signal created by an integrator 217 and a capacitor 63 is supplied to the comparator 218. Furthermore, the output signal of the comparator 218 is twice differentiated by the differentiators 95 and 95', and the differential of second order is supplied to an adder 96. The adder 96 generates the addition results, as the output signal Y, of the output signal of the comparator 200 and that of the differentiator 95'.

Fifth embodiment

Figure 11:
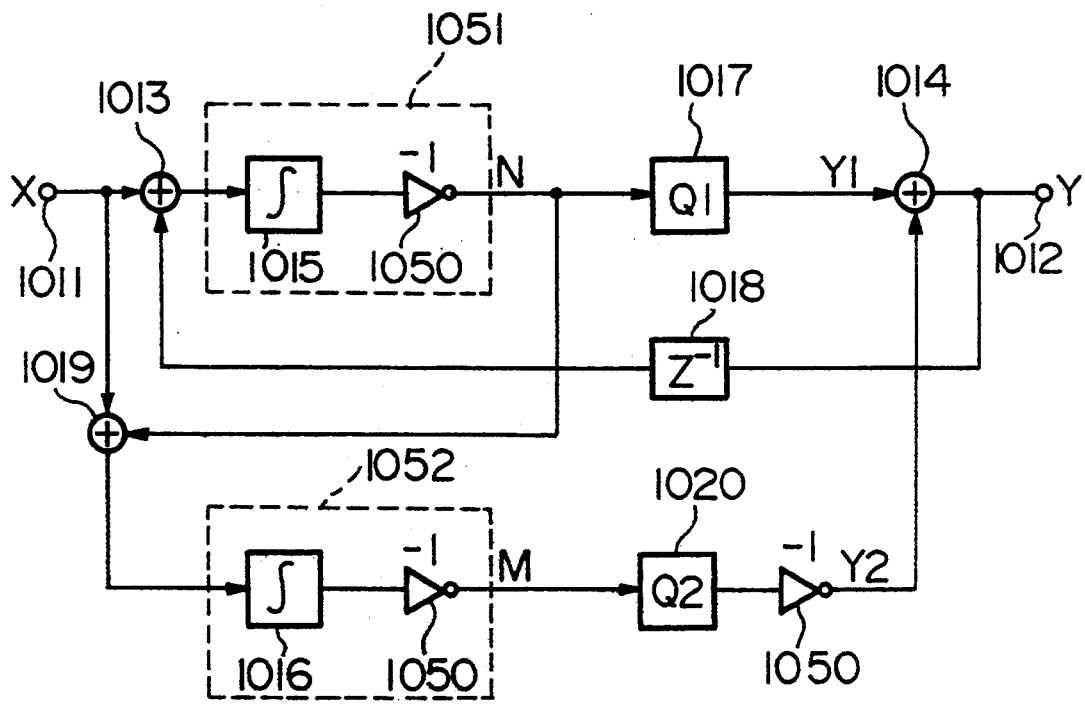
FIG. 11 is a block diagram showing the principle configuration of the fifth embodiment of the present invention.

FIG. 11 shows a principal configuration of the fifth embodiment of the present invention. In the drawing, components corresponding to those of FIG. 2 are attached with the same numeral added to "1000". However, the subtractors 13 and 19 shown in FIG. 2 are exchanged by adders 1013 and 1019 shown in FIG. 11. The configuration of this embodiment is similar to that shown in FIG. 2, further comprising a second quantizer 1020. Furthermore, according to the embodiment, the delay relating to the adder 14 is contained in loop circuits.

In the drawing, the numeral 1050 designates a sign inverter which inverts the sign of signal supplied thereto. The adder 1014 adds the output signal Y1 of the first quantizer 1017 with the output signal Y2, inverted by the sign inverter 1050, of the second quantizer 1020, and supplies the addition results to the one-sampling delay 1018.

The adder 1013 adds the output signal, delayed for one-sampling period, of the one-sampling delay 1018 with the input signal X, and supplies the addition results to the first integrator 1051.

The first integrator 1051 consists mainly of a sign inverter 1050 and an integrator 1015 which integrates the input signal thereto and supplies the integrated results to the sign inverter 1050. The sign inverter 1050 inverts the sign of the signal supplied thereto and supplies the inverted signal to the adder 1019 in the way of the output signal N. The adder 1019 adds the input signal X with the signal N generated by the first integrator 1051, and supplies the addition results to the second integrator 1052.

The second integrator 1052 consists mainly of an integrator 1016 and a sign inverter 1050'. The integrator 1016 integrates the signal supplied by the adder 1019, and supplies the integrated results to the sign inverter 1050'. The sign inverter 1050' inverts the sign of the signal input thereto and supplies the inverted results to the second quantizer 1020 as the output signal M. Meanwhile, the output signal N of the first integrator 1051 is supplied to the first quantizer 1017. Therefore, the adder 1014 receives the output signal Y1 of the first quantizer 1017 and the output signal Y2 inverted via the inverter 1050, and generates the addition results of the two signals in the way of the output signal Y.

FIG. 12 shows a first practical example of the fifth embodiment according to the present invention. The first integrator 1051 mainly consists of the integrator 1015 and the sign inverter 1050 in FIG. 11 is embodied by an RC integrator 10151. Similarly, the second integrator 1052 consists mainly of the integrator 1016 and the sign inverter 1050' and is embodied by an RC integrator 1152. The first and second quantizers 1017 and 1020 are embodied by comparators 1074 and 1074' respectively, to which a standard voltage 1070 is respectively applied. The one-sampling delay 1018 is embodied by a digital to analog converter 1071 which converts digital signals to analog signals. The sign inverter 1050 and the adder 1014 shown in FIG. 11, are embodied by a digital inverter 1072 and a digital adder 1073, respectively.

Furthermore, analog addition can be embodied only by connecting the input resistances In parallel. Because the output signal of the quantizer 1017 is a digital value, the digital-to-analog converter 1071 Is utilized for feeding back the signal to the input terminal of the integrator, for converting the signal to the analog value, and, simultaneously, for delaying the signal for a one-sampling period.

Figure 13:
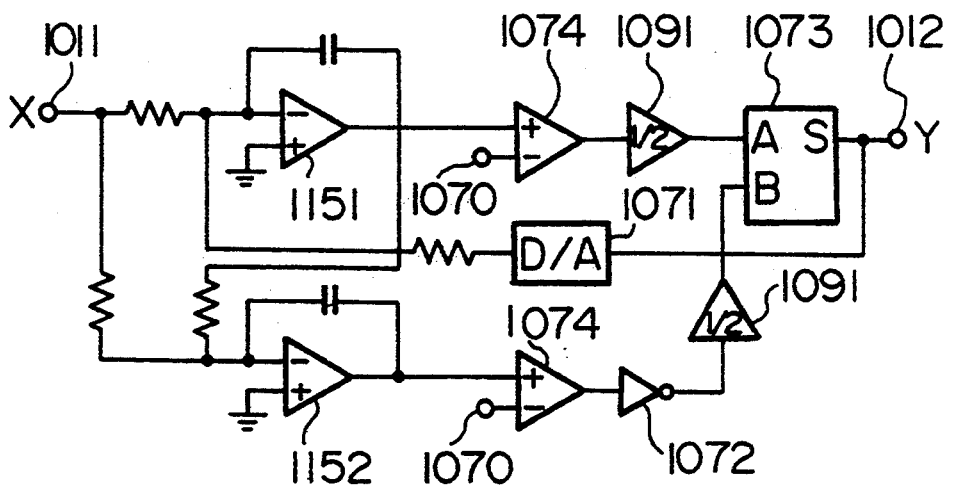
FIG. 13 is a circuit diagram of the noise shaping circuit according to a modification of the fifth embodiment of the present invention.

FIG. 13 shows a second practical example of the fifth embodiment according to the present invention.

In the drawing, the output signal of the first quantizer (comparator 1074) and that of the second quantizer (comparator 1074 and inverter 1072) are respectively multiplied by a specific value, "½" in this example, in a coefficient multiplier 91. Needless to say, the specific value does not need to be limited to "½". According to the circuit shown in FIG. 13, if the specific value is less than "1", the amplitude of the output signal of the digital-to-analog converter 1071 can be made small.

Figure 14:
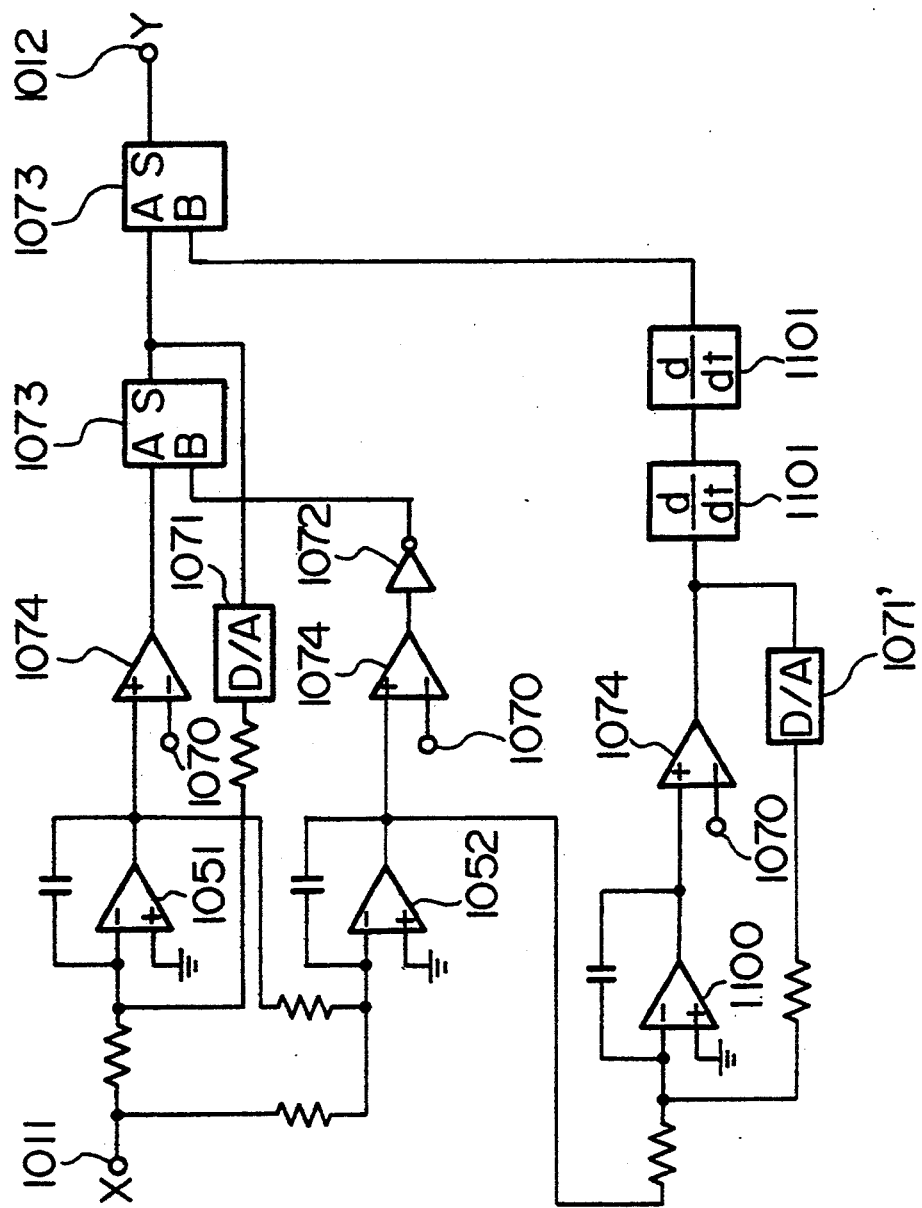
FIG. 14 is a circuit diagram of the noise shaping circuit according to another modification of the fifth embodiment of the present invention.

FIG. 14 shows a third practical example of the fifth embodiment according to the present invention. In the drawing, a multi-stage noise shaping technique is adopted for the circuit shown in FIG. 12 so as to obtain the third order noise shaping characteristics. According to the circuit, only an additional digital differentiator 1101 and associated components are required, but no special analog component is required.

Sixth embodiment

Figure 15:
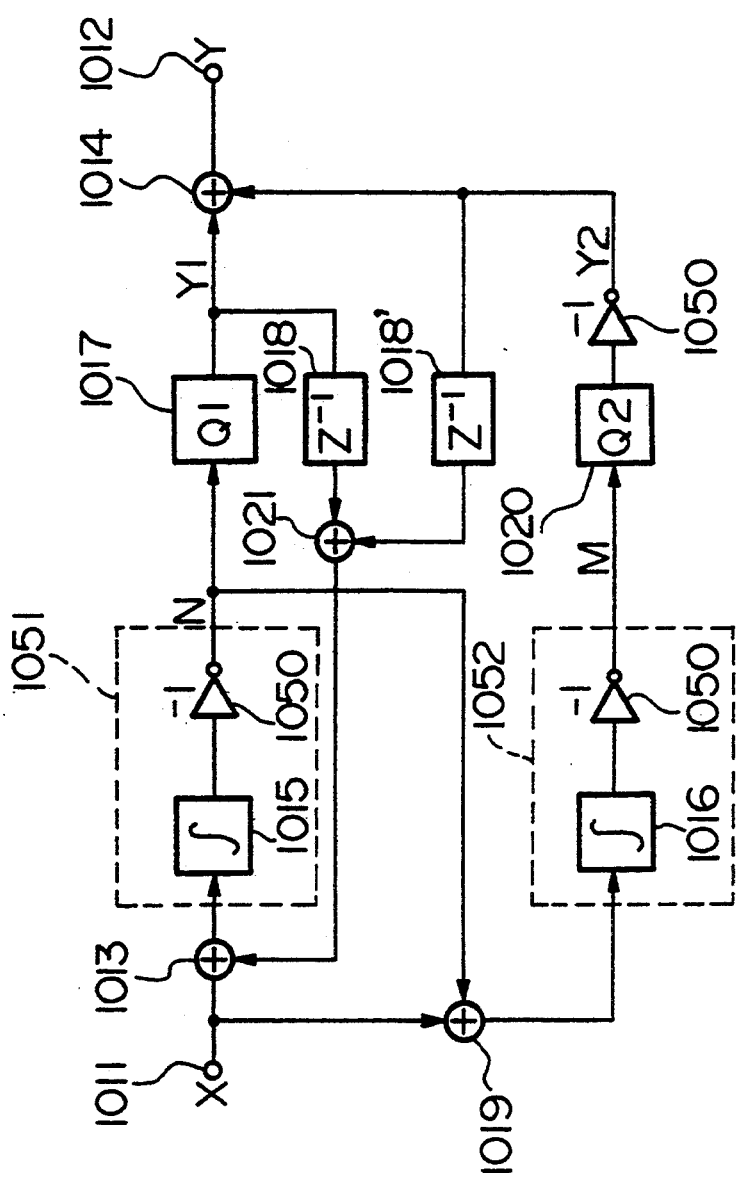
FIG. 15 is a block diagram showing the principle configuration of the sixth embodiment of the present invention.

FIG. 15 shows a principal configuration of the sixth embodiment of the present invention. In the drawing, components corresponding to those of FIG. 11 are attached with the same symbols. The composition shown in FIG. 15 is similar to that shown in FIG. 11, and also provides a one-sampling delay 1018 in addition to the delay 1018. The composition further providing an adder 1021 for adding the output signal of the first sampling delay 1018 with that of the second sampling delay 1018', and for supplying the addition results to the adder 1013. The adder 1014 similar to the first embodiment, adds the output signal Y1 of the first quantizer 1017 and the output signal Y2 of the second quantizer 1020. However, the sixth embodiment is advantageous because the adder 1014 is not contained in any loop circuit.

The details of the sixth embodiment will be described next. The input signal X imparted to the input terminal 1011 is supplied to the first integrator 1051 and the adder 1019. The first integrator 1051 integrates and inverts the input signal X, and supplies the inverted signal N to the adder 1019. The adder 1019 adds the input signal with the output signal of the first integrator 1051, and supplies the addition results to the second integrator 1052. The second integrator 1052 integrates and inverts the output signal of the adder 1019, and supplies the inverted signal M to the second quantizer 1020. The second quantizer 1020 quantizes the supplied signal thereto and supplies the quantized signal to the sign inverter 1050. The sign inverter 1050 inverts the sign of the quantized signal and supplies the inverted signal Y2 to the adder 1014 and the second sampling delay 1018'. The adder 1021 adds the output signals respectively supplied by the first and second one-sampling delay 1018 and 1018', and supplies the addition results to the adder 1013.

Furthermore, the output signal Y1 of the first quantizer 1017 and output signal Y2 of the second quantizer 1020 are respectively supplied to the adder 1014. The adder 1014 adds the two signals supplied thereto and generate the addition results as the output signal Y.

The above described circuit can be expressed by the following formulae (23) to (26), with the proviso that $Q_1$ and $Q_2$ respectively designate the quantize noise of first and second quantizers 1017 and 1020, $Y_1$ designates the output signal of the first quantizer 1017, and $Y_2$ designates the inverted output signal of the second quantizer 1020.

$$N = \frac{-1}{1 - z^{-1}} (X + (Y_1 z^{-1} + Y_2 z^{-1})) \quad (23)$$

$$M = \frac{-1}{1 - z^{-1}} (N - X) \quad (24)$$

$$Y_1 = N + Q_1, \quad Y_2 = -(N + Q_2) \quad (25)$$

-continued
$$Y = Y_1 + Y_2 \quad (26)$$

When the above formulae (23) to (26) are solved for Y, the following formula (27) will be obtained.

$$Y = X + (1 - z^{-1})^2 (Q_1 + Q_2) \quad (27)$$

Accordingly, though the quantize noise becomes $Q_1 + Q_2$, the formula (27) has a similar configuration to formulae (9) and (20). Hence, it is understood that the circuit shown in FIG. 15 has the complete secondary noise shaping characteristics.

Figure 16:
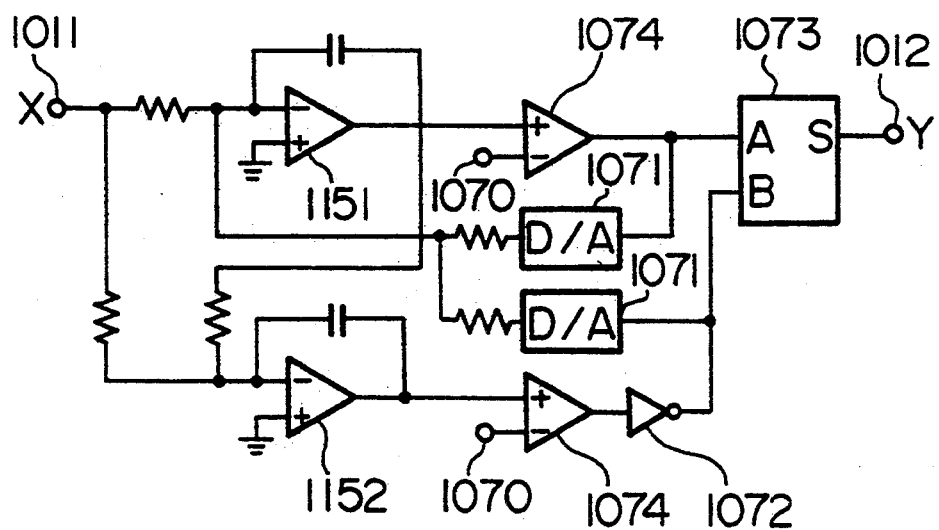
FIG. 16 is a circuit diagram of the noise shaping circuit according to the sixth embodiment of the present invention.
Figure 17:
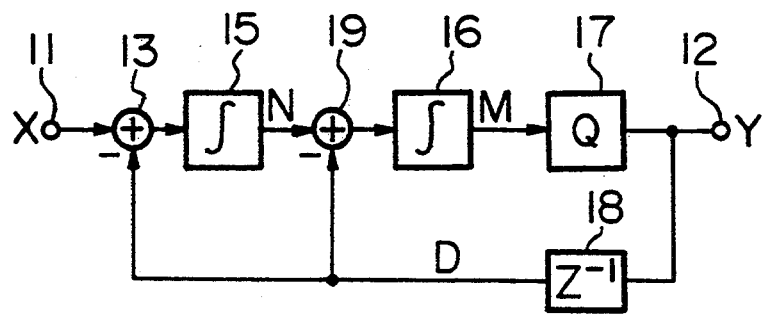
FIG. 17 is a block diagram showing the conventional noise shaping digital circuit.
Figure 18:
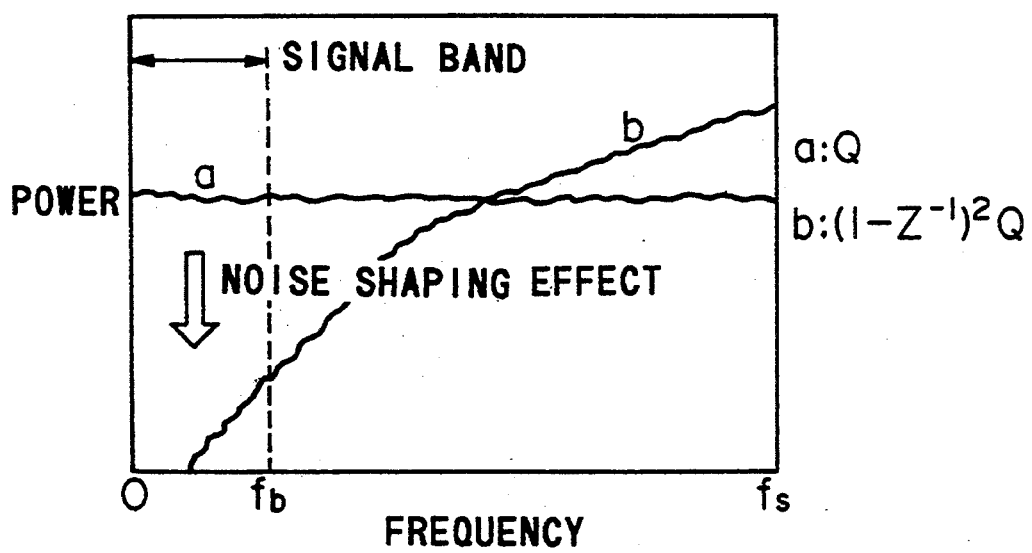
FIG. 18 is a chart of frequency characteristic showing the noise shaping effect concerning the quantize noise Q.

FIG. 16 shows the practical example of the noise shaping circuit according to the sixth embodiment of the present invention.

In the drawing, one-sampling delays 1018 and 1018' are embodied by digital to analog converters 1071 and 1071', respectively which are connected in parallel. As described above, according to the circuit, the digital adder 1073 is not contained in any loop. Therefore, signal delay, due to the adder 1073, will not affect the loops. As a result, the phase margin will be enlarged and the stability will be improved.

As described above, the sixth embodiment is advantageous, when compared with the other embodiments shown in FIGS. 2 and 20, at realizing an A-to-D converter by means of an analog circuit having the second quantizer 1020 and the inverter 1050. Furthermore, according to the sixth embodiment, the characteristics and performances as similar to those of the first to fourth embodiment can be obtained. Therefore, it is possible to widen the dynamic range of the input signal and to improve the S/N ratio. Furthermore, this embodiment, having only the adder 1014 as an analog component, is advantageous for realizing in LSI circuits. Incidentally, the output signals of the quantizers, being in the form of digital signal, can be inverted by the digital inverter with ease.

The preferred embodiments described heretofore are illustrative and not restrictive. Therefore, this invention may be practiced or embodied in still other ways without departing from the essential character thereof. Therefore, the scope of the invention being indicated by the appended claims, and all variations which come within the meaning of the claims are intended to be embraced therein.

What is claimed is:

1. A noise shaping method comprising the steps of:
   obtaining a first difference between an input signal and an output signal;
   integrating the first difference to obtain a first integration result;
   obtaining a second difference between the first integration result and the input signal;
   integrating the second difference to obtain a second integration result;
   multiplying the first integration result by a first coefficient;
   multiplying the second integration result by a second coefficient;
   obtaining addition results by adding the first integration result multiplied by the first coefficient, and the second integration result multiplied by the second coefficient; and
   quantizing the addition results to obtain the output signal.

2. A noise shaping circuit comprising:

delay means for delaying an output signal for one sampling period to obtain a delayed signal;

first subtraction means for subtracting the delayed signal from an input signal supplied to an input terminal so as to obtain first subtraction results;

first integration means for integrating the first subtraction results so as to obtain first integration results;

second subtraction means for subtracting the input signal from the first integration results so as to obtain results;

second integration means for integrating the second subtraction results so as to obtain second integration results;

adding means for adding the first and second integration results so as to obtain addition results;

quantizer means for quantizing the addition results to obtain the output signal; and, feedback means for feeding back the output signal to the first subtraction means through the delay means.

3. A noise shaping circuit according to claim 2 further comprising:

first multiplier means for multiplying the first integration results by a first coefficient; and second multiplier means for multiplying the second integration results by a second coefficient.

4. A noise shaping circuit according to claim 2 further comprising:

amplifier means for amplifying one of the first and second subtraction results;

third integration means which includes first amplifier means for integrating and inverting an output signal of the first subtraction means;

fourth integration means which includes second amplifier means for integrating and inverting an output signal of the second subtraction means; and quantizer means for executing, by means of a differential comparator, a quantization on the basis of the output signals of the third and fourth integration means.

5. A noise shaping circuit comprising:

delay means (1081) for delaying an output signal for one sampling period to obtain a delayed signal;

first addition means (1013) for adding the delayed signal with an input signal supplied to an input terminal (1011) so as to obtain a first addition result;

first integration means (0151) for integrating the first addition result, and for inverting the results thereof so as to generate a first integration signal;

second integration means (1052) for integrating a signal generated by adding the first integration signal and the input signal, and for inverting the results thereof so as to generate a second integration signal;

a first quantizer (1017) for generating a first quantized signal by quantizing the first integration signal;

a second quantizer (1020) for generating a second quantized signal by quantizing the second integration signal; and second addition means (1014, 1050, 1050, 1073, 1072, 1091, 1073, 1072) for generating second addition results or complicated second addition results as the output signal, and for supplying the output signal to the delay means and an output terminal (1012), the second addition results being obtained by adding an inverted signal, obtained by inverting the second quantized signal, with the first quantized signal, the complicated second addition results being obtained by adding a first multiple result, which is obtained by multiplying the first quantized signal by a first value less than 1, with a second multiple result, which is obtained by inverting and multiplying the second quantized signal by a second value less than 1.

6. A noise shaping circuit comprising:

a first quantizer (1017) for quantizing a first signal applied thereto so as to obtain a first quantized signal;

a second quantizer (1020) for quantizing a second signal applied thereto so as to obtain a second quantized signal;

first addition means (1013) for adding an input signal supplied to an input terminal with an additional signal;

first integration means (1051) for integrating addition results generated by the first addition means (1013), and for inverting the results thereof so as to obtain the first signal;

second integration means (1052) for integrating addition results which is obtained by adding the first signal with the input signal, and for inverting the results thereof so as to obtain the second signal which is supplied to the second quantizer (1020);

second addition means (1014) for generating an output signal by adding the first quantized signal with an inverted signal which is obtained by inverting the second quantized signal; and third addition means (1021) for generating the addition signal obtained by adding a first delayed signal with an inverted output signal, and for supplying the addition signal to the first addition means (1013), the first delayed signal being generated by delaying the first quantized signal for a one sampling period by means of first delay means (1018), the inverted output signal being generated by delaying an inverted signal, which is obtained by inverting the second quantized signal, for the one sampling period by means of second delay means (1018').

* * * * *

United States Patent and Trademark Office
CERTIFICATE OF CORRECTION

PATENT NO. : 5,416,483  
DATED : May 16, 1995  
INVENTOR(S) : Yasuyuki MATSUYA

It is certified that error appears in the above-indentified patent and that said Letters Patent is hereby corrected as shown below:

Claim 2, Column 15, Line 11, after "obtain" insert --second subtraction--.

Claim 5, Column 15, Line 44, change "(1081)" to --(1018)--.

Claim 5, Column 15, Line 49, change "(0151)" to --(1051)--.

Claim 5, Column 16, Line 6, delete "1050," (Second Occurrence).

UNITED STATES PATENT AND TRADEMARK OFFICE
CERTIFICATE OF CORRECTION

PATENT NO. : 5,416,483
DATED : May 16, 1995
INVENTOR(S) : Yasuyuki Matsuya

It is certified that error appears in the above-indentified patent and that said Letters Patent is hereby corrected as shown below:

Claim 5, Column 16, Lines 6 & 7, parenthetical should read --(1014;1050, 1073;1072, 1091;1073;1072)--.

Signed and Sealed this

Twenty-eighth Day of November 1995

Attest:

BRUCE LEHMAN

Attesting Officer   Commissioner of Patents and Trademarks